(12) United States Patent
You et al.

(10) Patent No.: US 8,677,222 B2
(45) Date of Patent: Mar. 18, 2014

(54) METHOD AND DEVICE FOR DECODING REED-SOLOMON (RS) CODE

(75) Inventors: Yueyi You, Guangdong Province (CN);
Qiang Li, Guangdong Province (CN);
Ning Qiu, Guangdong Province (CN);
Nanshan Cao, Guangdong Province (CN); Tao Zhang, Guangdong Province (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 130 days.

(21) Appl. No.: 13/258,449

(22) PCT Filed: May 4, 2010

(86) PCT No.: PCT/CN2010/072422
§ 371 (c)(1), (2), (4) Date: Jan. 13, 2012

(87) PCT Pub. No.: WO2011/032387
PCT Pub. Date: Mar. 24, 2011

(65) Prior Publication Data
US 2012/0166915 A1    Jun. 28, 2012

(30) Foreign Application Priority Data
Sep. 15, 2009  (CN) .......................... 2009 1 0172185

(51) Int. Cl.
*H03M 13/00* (2006.01)
(52) U.S. Cl.
USPC ............................ 714/784; 714/780; 714/785
(58) Field of Classification Search
USPC ........................................ 714/780, 784, 785
See application file for complete search history.

(56) References Cited

U.S. PATENT DOCUMENTS

| 6,634,007 B1 | 10/2003 | Koetter et al. | |
| 7,831,895 B2 * | 11/2010 | Lin | 714/800 |

(Continued)

FOREIGN PATENT DOCUMENTS

| CN | 1369984 A | 9/2002 |
| CN | 1825773 A | 8/2006 |

(Continued)

OTHER PUBLICATIONS

Ta-Hsiang Hu, et al. An Efficient Hybrid Decoding Algorithm for Reed-Solomon Codes Based on Bit Reliability; IEEE Transactions on Communications. vol. 51, No. 7, Jul. 1, 2003, pp. 1073-1081, XP11099041, ISSN: 0090-6778, DOI: 10.1109/TCOMM.2003.814212.

(Continued)

*Primary Examiner* — Esaw Abraham
(74) *Attorney, Agent, or Firm* — Ling Wu; Stephen Yang; Ling and Yang Intellectual Property (57) ABSTRACT

The embodiments of the invention disclose a method and a device for decoding an RS code, the method comprising: receiving bit reliability information of the RS code output by a channel, performing a hard decision on the bit reliability information to obtain a hard-decision result value sequence; determining a type of an error of the hard-decision result value sequence according to an initial check array corresponding to an encoding mode of the RS code; according to preset corresponding relationships between types of errors of the hard-decision result value sequence and error-correcting modes capable of correcting the errors, determining an error-correcting mode corresponding to the type of the error of the hard-decision result value sequence, and performing a bit error correction on the hard-decision result value sequence according to the determined error-correcting mode; outputting the hard-decision result value sequence after the bit error correction as a decoding result.

18 Claims, 3 Drawing Sheets

(56) References Cited

U.S. PATENT DOCUMENTS

| | | | |
|---|---|---|---|
| 7,882,422 B2* | 2/2011 | Song et al. | 714/776 |
| 8,069,390 B2* | 11/2011 | Lin | 714/758 |
| 8,085,878 B2* | 12/2011 | Choi et al. | 375/326 |
| 8,116,381 B2* | 2/2012 | Choi et al. | 375/240.25 |
| 8,291,304 B2* | 10/2012 | Yoshida et al. | 714/795 |
| 8,295,374 B2* | 10/2012 | Kuo et al. | 375/260 |
| 8,325,849 B2* | 12/2012 | Kim et al. | 375/295 |

FOREIGN PATENT DOCUMENTS

| | | |
|---|---|---|
| CN | 101656541 A | 2/2010 |
| WO | 03103152 A2 | 12/2003 |

OTHER PUBLICATIONS

Arshad Ahmed, et al."Performance Analysis of the Adaptive Parity Check Matrix Based Soft-decision Decoding Algorithm", Coordinated Science Laboratory University of Illinois at Urbana-Champaign 1308, West Main Street, Urbana, IL 61801. vol. 2, Nov. 7, 2004-Nov. 10, 2004, pp. 1995-1999, XP10781178, ISBN: 0-7803-8622.

Haitao Xia; Cruz J R: "Reliability-Based Reed-Solomon Decoding for Magnetic Recording Channels", IEEE Transactions on Magnetics, vol. 42, No. 10, Oct. 2006, pp. 2603-2605, XP002684928, ISSN: 0018-9464, DOI: 10.1109/TMAG.2006.878651.

Fossorier Marc P. C. et al. "Soft Decision Decoding of Linear Block Codes Based on Ordered Statistics", IEEE Transactions on Information Theory, IEEE Press, USA, vol. 41, No. 5, Sep. 1, 1995, pp. 1379-1396, XP000542626, ISSN: 0018-9448.

The Fast Decoding Algorithim of [256,252] RS Extended Code, Zhang Yu-liang Chen Xiao-min, Journal of Electronics & Information Technology, vol. 27 No. 12, Dec. 31, 2005.

International Search Report for PCT/CN2010/072422 dated Aug. 2, 2010.

\* cited by examiner

METHOD AND DEVICE FOR DECODING REED-SOLOMON (RS) CODE

TECHNICAL FIELD

The present invention relates to the field of channel error-correcting coding and decoding, and especially to a method and device for decoding an RS (Reed-Solomon) code.

BACKGROUND OF THE RELATED ART

RS codes belong to linear block codes, and the construction and discovery of RS codes are considered as the perfect combination of theoretical mathematics and engineering implementation. RS codes have a powerful correcting ability and are the unique kind of applicable codes having the maximum inter-code distance. Therefore, RS codes have been widely used from information storage system, deep space communication to modern wireless communication.

In recent decades, the decoding of an RS code has always used hard-decision decoding, including mainly two big categories: BM (Boyer-Moore) algorithm and EMA (Exponential Moving Average) algorithm, which has a big loss in performance compared with soft-decision decoding. The fatal deficiency of RS codes is that no simple and efficient soft-decision decoding method has been found yet.

In recent years, the study on soft-decision decoding for RS codes has become a study hot topic and people have been devoted to seek an efficient soft-decision decoding method. In 2004, a relatively simple KV soft-decision decoding algorithm was disclosed, vide R. Kotter and A. Vardy, "Algebraic soft-decision decoding of Reed-Solomon codes IEEE" Trans. Inform. Theory, vol. 49, no. 11, pp. 2809-2825, November 2004. The algorithm is based on modern algebra and has polynomial complexity. However, since the algorithm involves interpolation and factorization of limited domain two-variable polynomial, its complexity is still high, and the algorithm is just suitable for the decoding for frequency domain encoding of RS codes and can not be applied directly to the time domain encoding of RS codes widely used in the current engineer applications. In the same year, an ABP (Adaptive Belief Propagation) soft-decision decoding algorithm was disclosed, vide J. Jiang and K. Narayanan, "Iterative soft decision decoding of Reed Solomon code based on adaptive parity check matrices," in Proc. ISIT, 2004. ABP algorithm is an iteration decoding algorithm having good performance, and is one having the best performance among the known RS decoding algorithms. However, the kind of iteration decoding algorithm needs to perform Gaussian elimination and belief propagation algorithm of the check array in each iteration process, which has a high complexity, and it is now still in the stage of laboratory simulation, and there is still a long way to go before the algorithm is applied in engineering.

Therefore, the existing hard-decision decoding and soft-decision decoding method for RS codes has deficiencies such as high complexity, not suitable for time domain encoding and so on.

SUMMARY OF THE INVENTION

The embodiments of the invention provide a method and device for decoding an RS code, to improve decoding performance of RS codes, and reduce decoding complexity.

A method for decoding an RS code, the method comprising:

receiving bit reliability information of the RS code output by a channel, performing a hard decision on the bit reliability information to obtain a hard-decision result value sequence;

determining a type of an error of the hard-decision result value sequence according to an initial check array corresponding to an encoding mode of the RS code;

according to preset corresponding relationships between types of errors of the hard-decision result value sequence and error-correcting modes capable of correcting the errors, determining an error-correcting mode corresponding to the type of the error of the hard-decision result value sequence, and performing a bit error correction on the hard-decision result value sequence according to the determined error-correcting mode;

outputting the hard-decision result value sequence after the bit error correction as a decoding result.

A device for decoding an RS code, the device comprising:

a channel information receiving unit configured to receive bit reliability information of the RS code output by a channel;

a hard-decision unit configured to perform a hard decision on the bit reliability information to obtain a hard-decision result value sequence;

an error type determining unit configured to determine a type of an error of the hard-decision result value sequence according to an initial check array corresponding to an encoding mode of the RS code;

a bit error correcting unit configured to, according to preset corresponding relationships between types of errors of the hard-decision result value sequence and error-correcting modes capable of correcting the errors, determine an error-correcting mode corresponding to the type of the error of the hard-decision result value sequence, and perform a bit error correction on the hard-decision result value sequence according to the determined error-correcting mode;

a decoding result outputting unit configured to output the hard-decision result value sequence after the bit error correcting unit performing the bit error correction as a decoding result.

In the invention, after a hard decision is performed on the bit reliability information of the RS code output by a channel, the type of the error of the hard-decision result value sequence is determined according to an initial check array corresponding to an encoding mode of the RS code, and according to preset corresponding relationships between types of errors of the hard-decision result value sequence and error-correcting modes capable of correcting the errors, the error-correcting mode corresponding to the obtained type of the error of the hard-decision result value sequence is determined, and a bit error correction is performed on the hard-decision result value sequence according to the error-correcting mode, and the hard-decision result value sequence after the bit error correction is output as a decoding result. By classifying the types of errors of the hard-decision result value sequence, and using different decoding modes for different error types, the decoding performance of RS codes is efficiently improved, and the decoding complexity is reduced.

PREFERRED EMBODIMENTS OF THE PRESENT INVENTION

To improve the decoding performance of an RS code and reduce the decoding complexity, the embodiments of the invention provide a method for decoding an RS code. In the method, the types of errors of the hard-decision result value sequence obtained after performing hard decision on the bit reliability information of the RS code output by a channel are classified, and different decoding modes are used for different types of errors according to preset corresponding relationships between types of errors of the hard-decision result value sequence and error-correcting modes capable of correcting the errors.

Figure 1:
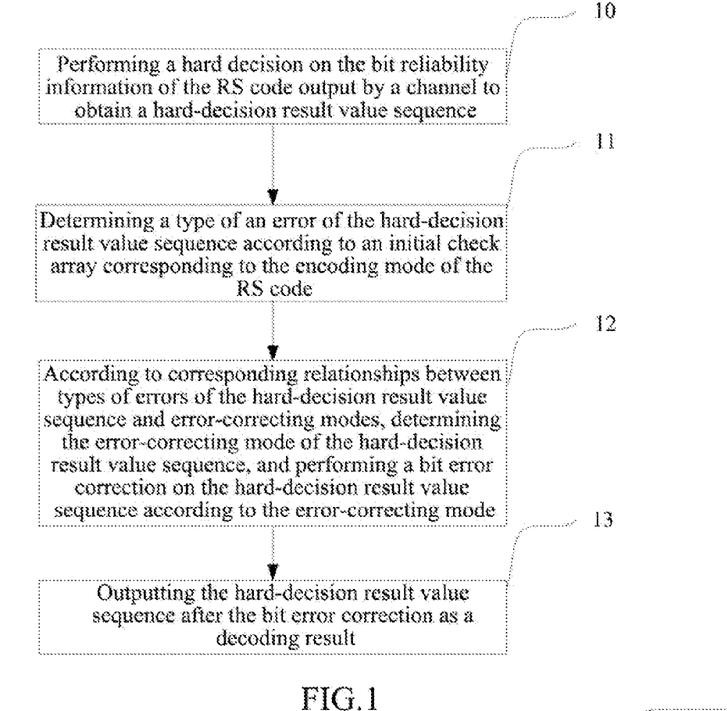
FIG. 1 is a schematic flowchart of a method provided in the embodiment of the invention.

With reference to FIG. 1, the method for decoding an RS code provided in the embodiment of the invention specifically comprises the following steps:

step 10: receiving bit reliability information of the RS code output by a channel, and performing a hard decision on the bit reliability information to obtain a hard-decision result value sequence;

step 11: determining a type of an error of the hard-decision result value sequence according to an initial check array corresponding to an encoding mode of the RS code;

step 12: according to preset corresponding relationships between types of errors of the hard-decision result value sequence and error-correcting modes capable of correcting the errors, determining an error-correcting mode corresponding to the type of the error of the hard-decision result value sequence determined in the step 11, and performing a bit error correction on the hard-decision result value sequence according to the error-correcting mode;

step 13: outputting the hard-decision result value sequence after the bit error correction as a decoding result.

In the step 10, the bit reliability information of the RS code comprises n reliability numerical values, and the initial check array also comprises n columns, i.e. the n columns of numbers comprised in the initial check array has the same number as the reliability numerical values comprised in the bit reliability information of the RS code.

Performing a hard decision on the bit reliability information of the RS code refers to, for each reliability numerical value comprised in the bit reliability information, judging whether the reliability numerical value is smaller than or equal to 0, if yes, setting the hard-decision result value corresponding to the reliability numerical value to be 0, or else, setting the hard-decision result value corresponding to the reliability numerical value to be 1; all the hard-decision result values obtained by the hard-decision constitute a hard-decision result value sequence. For example, if the bit reliability information is $L(c_i)=\{0.1, 0.5, 0.2, 0.3, -0.6, -0.3\}$, then the hard-decision result value sequence constituted by the hard-decision result values is: [1, 1, 1, 1, 0, 0].

It can be seen that the number of hard-decision result values comprised in the hard-decision result value sequence is the same as the number of the columns of the initial check array.

The step of determining a type of an error of the hard-decision result value sequence according to the bit reliability information and the initial check array is specifically implemented as follows:

firstly, sequencing reliability numerical values comprised in the bit reliability information;

secondly, selecting (n-k) columns corresponding to (n-k) smallest reliability numerical values after the sequencing from the initial check array, converting the selected (n-k) columns in the initial check array to a unit array by the Gaussian elimination method; wherein, the n is binary code length of the RS code, and the k is binary information length of the RS code before being encoded;

lastly, determining that the type of the error of the hard-decision result value sequence is a low reliability error or a mixed type error according to the new check array.

It is defined that $L(c_i)$ represents bit reliability information output by the channel, H represents a binary initial check array, $\hat{H}$ represents the new check array obtained from the H after the Gaussian elimination; it is defined that the bits in the hard-decision result value sequence corresponding to the (n-k) columns whose column weight is 1 in the new check array $\hat{H}$ constitute a low reliability bit set, noted as $B_{low}$, the bits in the hard-decision result value sequence corresponding to the remaining k columns constitute a high reliability bit set, noted as $B_{hi}$; if the error occurs only on the bits in the low reliability bit set, the error is called as the low reliability type error; if the error occurs only on the bits in the high reliability bit set, the error is called as the high reliability type error; if the error occurs on the bits both in the low reliability bit set and in the high reliability bit set, the error is called as the mixed type error.

Since the new check array is the matrix array obtained after performing Gaussian elimination on the initial check array, the number of the hard-decision result values comprised in the hard-decision result value sequences is the same with the number of columns of the new check array, and the columns of the new check array sequentially correspond one by one to the hard-decision result values comprised in the hard-decision result value sequence before the sequencing. For example, the $1^{st}$ column of the new check array corresponds to the $1^{st}$ hard-decision result value in the hard-decision result value sequence, and the $2^{nd}$ column of the new check array corresponds to the $2^{nd}$ hard-decision result value in the hard-decision result value sequence, and so forth, the $i^{th}$ column of the new check array corresponds to the $i^{th}$ hard-decision result value in the hard-decision result value sequence, wherein, the value of i is from 1 to n.

The specific implementation of the above determining that the type of the error of the hard-decision result value sequence is a low reliability error or a mixed type error according to the new check array may comprise the following step A to step C:

step A: constituting a hard-decision vector having the same number of rows as the new check array by every hard-decision result value in the hard-decision result value sequence.

For example, if the bit reliability information is $L(c_i)=\{0.1, 0.5, 0.2, 0.3, -0.6, -0.3\}$, then the hard-decision vector constituted by the hard-decision result values is the transposed matrix column of [1, 1, 1, 1, 0, 0].

step B: calculating the product of the new check array and the current hard-decision vector, and performing a modulo 2 operation on the result to obtain an adjoint vector; determining the number of 1 in the adjoint vector, and taking the determined number as an adjoint vector weight;

step C: judging whether the adjoint vector weight is less than a preset threshold value, and if yes, determining that the type of the error of the hard-decision result value sequence is the low reliability error; or else, determining that the type of the error of the hard-decision result value sequence is the mixed type error.

Herein, the preset threshold value is specifically taken in integers bigger than 0, and its value is dependent on the initial check array of RS code and can be obtained by simulation statistics. Preferably, for the RS code whose code length is 31 and information length is 25, the value may be 10 according to the simulation result.

In the step 12, when the type of the error of the hard-decision result value sequence is the low reliability error, the following two modes may be used as the corresponding error-correcting mode:

the first one, searching the adjoint vector for rows whose numerical values are 1, and determining the columns whose numeral values are 1 in the rows in the new check array; then flipping bits corresponding to the columns in the hard-decision result value sequence, and taking the hard-decision result value sequence after the bit flipping as the decoding result.

Herein, it is assumed that the new check array has X rows and n columns and the hard-decision vector has n rows and 1 column, then the adjoint vector has X rows and 1 column, wherein, the number of the rows of the adjoint vector is the same with the number of the rows of the new check array.

the second one, recoding and calculating check bits by taking high reliability bits in the hard-decision result value sequence as information bits and the new check array as a check warranty, and updating low reliability bits in the hard-decision result value sequence using obtained the check bits; wherein, the low reliability bits are the bits corresponding to the (n-k) information having the smallest numerical values after sequencing the bit reliability information, and the high reliability bits are k bits other than the bits corresponding to the (n-k) information having the smallest numerical values.

When the present way is used, the specific implementation may be: firstly, extracting each of columns other than the (n-k) columns in the new check array to constitute a high reliability type matrix array, extracting the (n-k) columns in the new check array to constitute a low reliability type matrix array, and extracting k numerical values in the hard-decision vector to constitute an encoding vector, wherein, the k numerical values are the hard-decision result values corresponding to k reliability numerical values other than the (n-k) smallest reliability numerical values in the bit reliability information; then, for each row in the high reliability type matrix array, multiplying the row by the encoding vector, and adding the multiplying result to itself, and then modulus result 0 or 1 is obtained after performing modulus on 2 for the adding result, and determining the columns in the new check array of numerical value 1 in the row in the low reliability type matrix array, and updating the bits in the hard-decision result value sequence corresponding to the columns to be the modulus result. The hard-decision result value sequence after the bit updating is taken as the decoding result.

Of course, for the low reliability type error, other common decoding modes, such as hard-decision decoding, KV soft-decision decoding mode, self-adaptive belief propagation decoding algorithm and so on, may also be used.

In the step 12, if the type of the error of the hard-decision result value sequence is the mixed type error, then the following two modes may be used as the corresponding error-correcting mode:

the first one:

step a: for each of columns other than the (n-k) columns in the new check array, calculating the associated value of the present column with the current adjoint vector; selecting a maximum associated value obtained by calculation, determining columns in the new check array used for calculating the maximum associated value, and flipping bits in the current hard-decision vector corresponding to the columns; adding 1 to the number of times of iteration, whose initial value is 0;

step b: calculating the product of the new check array and the current hard-decision vector, and performing a modulo 2 operation on the result to obtain an adjoint vector; determining the number of 1 in the adjoint vector, and taking the number as an adjoint vector weight;

step c: judging whether the adjoint vector weight is less than the preset threshold value, and if yes, determining that the type of the error of the hard-decision result value sequence is the low reliability error, and performing the error correction according to the above error-correction mode corresponding to the low reliability type error; or else, determining that the type of the error of the hard-decision result value sequence is the mixed type error, and proceeding to step d;

step d: judging whether the maximum number of times of iteration is met, is yes, outputting directly the hard-decision result value sequence as the decoding result; or else, returning to step a.

the second one, outputting directly the hard-decision result value sequence as the decoding result.

Of course, for the mixed type error, other common decoding modes, such as hard-decision decoding, KV soft-decision decoding algorithm, self-adaptive belief propagation decoding algorithm and so on, may also be used.

Figure 2:
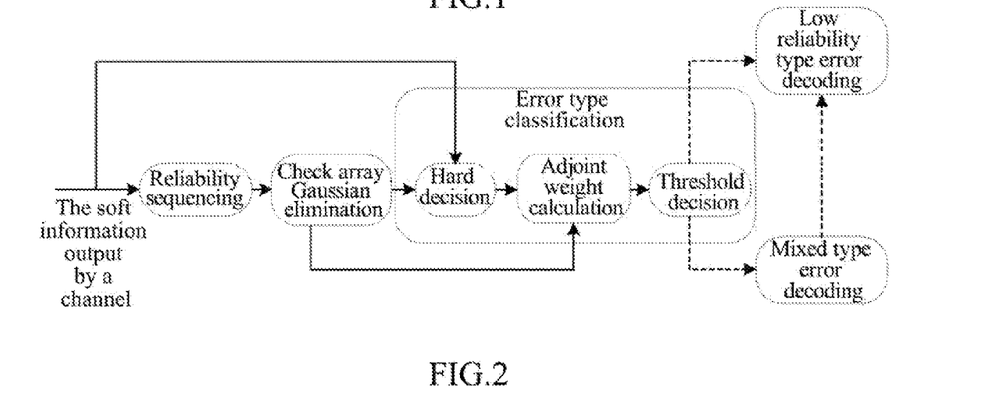
FIG. 2 is a schematic flowchart of a specific embodiment of the invention.

The invention will be further described in detail below through specific examples.

the method for decoding the types of errors of RS code may be represented as the steps performed according to the following way:

step A, sequencing the bit reliability information the received code bit reliability information is $L(c_0)$, $(c_1), \ldots, L(c_{n-1})$ in order, whose subscripts are noted as $i_0$, $i_1, \ldots, i_{n-1}$ after ascending sequencing according to absolute values.

step B, converting the check array to a similar unit array by Gaussian elimination the specific steps of the Gaussian elimination process are as follows:

B0) converting the $i_0^{th}$ column of the check array H to the form of $[1\ 0\ \ldots\ 0]^T$ B1) converting the $i_k^{th}$ column of the check array H to the form of $[0\ 1\ \ldots\ 0]^T$ B2) converting the $i_k^{th}$ column of the check array H to the form of $$\left[\underbrace{0\ \ldots\ 0}_{k}\ 1\ \ldots\ 0\right]^T,$$

and if the $i_k^{th}$ column of H can not be converted to the form of $$\left[\underbrace{0\ \ldots\ 0}_{k}\ 1\ \ldots\ 0\right]^T,$$

giving up the column, and trying to convert the $i_{k+1}^{th}$ column to the above form;

B3) not noting the new check array as $\hat{H}$ until (n-k) columns in the check array H have been converted to unit array.

step C, classifying the error bit types the method for classifying the error bit types is as follows:

C0) hard decision:

$$y_i = \begin{cases} 0, & L(c_i) \leq 0 \\ 1, & L(c_i) > 0; \end{cases}$$

C1) calculating the adjoint vector $S = \hat{H} \cdot \hat{y}$;

C2) calculating the adjoint vector weight $$W = \sum_{i=0}^{n-k-1} s_i;$$

C3) if $W < \gamma$, turning to step D, or else, turning to step E.

step D, low reliability type error decoding

D0) finding all the check equations corresponding to 1 in the adjoint vectors S;

D1) finding all the locations of 1 corresponding to the low reliability bit set in the above check equations, flipping the bits corresponding to the locations and ending the decoding.

step E, the mixed type error decoding

E0) calculating associated values of all the columns of the new check array corresponding to the high reliability bits with the adjoint vector;

E1) searching for the high reliability bit corresponding to the maximum associated value and flipping the bit;

E2) recalculating the adjoint vector;

E3) returning to step C3) for the iteration till that the maximum number of times of iteration is met.

Wherein, the decoding modes for the step D and step E are various, which have been previously described, and here provides only an example.

Figure 3:
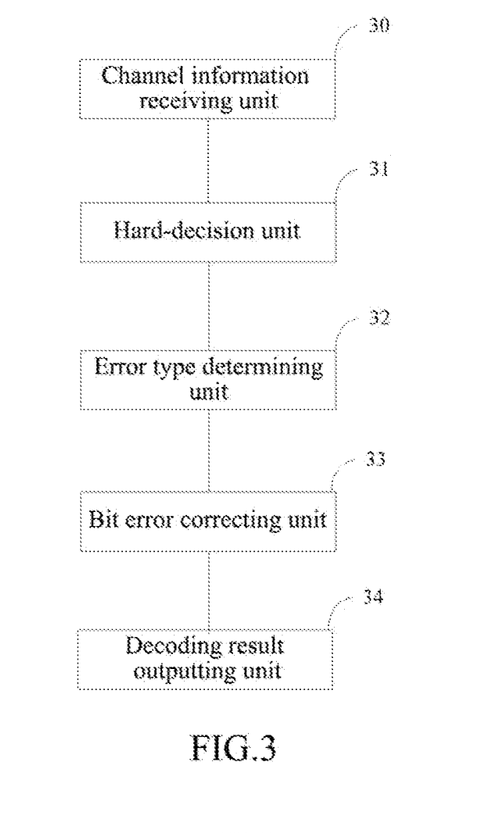
FIG. 3 is a schematic diagram of the structure of a device provided in the embodiment of the invention.

With reference to FIG. 3, the embodiment of the invention has also provides a device for decoding an RS code, the device comprising:

a channel information receiving unit 30, which is configured to receive bit reliability information of RS code output by a channel;

a hard-decision unit 31, which is configured to perform a hard decision on the bit reliability information to obtain a hard-decision result value sequence;

an error type determining unit 32, which is configured to determine a type of an error of the hard-decision result value sequence according to an initial check array corresponding to an encoding mode of the RS code;

a bit error correcting unit 33, which is configured to, according to preset corresponding relationships between types of errors of the hard-decision result value sequence and error-correcting modes capable of correcting the errors, determine an error-correcting mode corresponding to the type of the error of the hard-decision result value sequence, and perform a bit error correction on the hard-decision result value sequence according to the determined error-correcting mode;

a decoding result outputting unit 34, which is configured to output the hard-decision result value sequence after the bit error correcting unit performing the bit error correction as a decoding result.

The error type determining unit 32 comprises:

a reliability sequencing unit, which is configured to sequence reliability numerical values comprised in the bit reliability information;

a check array Gaussian eliminating unit, which is configured to select (n-k) columns corresponding to (n-k) smallest reliable numerical values after the sequencing from the initial check array, and convert the selected (n-k) columns to a unit array to obtain a new check array, wherein, the n is binary code length of the RS code, and the k is binary information length of the RS code before being encoded;

an error type classifying unit, which is configured to determine that the type of the error of the hard-decision result value sequence is a low reliability error or a mixed type error according to the new check array.

The error type classifying unit comprises:

an adjoint weight calculating unit, which is configured to constitute a hard-decision vector having the same number of rows as the new check array by every hard-decision result value in the hard-decision result value sequence, calculate a product of the new check array and the current hard-decision vector, and perform a modulo 2 operation on the result to obtain an adjoint vector; determine a number of 1 in the adjoint vector, and take the determined number as an adjoint vector weight;

a threshold deciding unit, which is configured to judge whether the adjoint vector weight is less than a preset threshold value, and if yes, determine that the type of the error of the hard-decision result value sequence is the low reliability error; or else, determine that the type of the error of the hard-decision result value sequence is the mixed type error.

The bit error correcting unit 33 comprises a first low reliability error decoding unit and/or a second low reliability error decoding unit, wherein:

the first low reliability error decoding unit is configured to search the adjoint vector for rows whose numerical values are 1, and determine columns whose numeral value in row is 1 in the new check array; flip bits corresponding to the columns in the hard-decision result value sequence;

the second low reliability error decoding unit is configured to recode and calculate check bits by taking high reliability bits in the hard-decision result value sequence as information bits and the new check array as a check warranty, and update low reliability bits in the hard-decision result value sequence with obtained the check bits; wherein, the low reliability bits are the bits corresponding to the (n-k) information having the smallest numerical values after sequencing the bit reliability information, and the high reliability bits are k bits other than the bits correspond to the (n-k) information having the smallest numerical values.

The bit error-correcting unit 33 comprises a first mixed type error decoding unit and/or a second mixed type error decoding unit, wherein:

the first mixed type error decoding unit is configured to, for each of columns other than the (n-k) columns in the new check array, calculate an associated value of the column with the current adjoint vector; select a maximum associated value obtained by calculation, determine columns in the new check array used for calculating the associated value, and flip bits in the current hard-decision vector corresponding to the columns, and trigger the adjoint weight calculating unit;

the second mixed type error decoding unit is configured to output the hard-decision result value sequence as a decoding result. The preset threshold value is a threshold value corresponding to the initial check array of the RS code obtained by simulation, whose specific value may be 10.

In conclusion, the advantages of the invention comprise:

In the schemes provided by the embodiments of the invention, after a hard decision is performed on the bit reliability information of an RS code output by a channel, the type of the error of the hard-decision result value sequence is determined according to an initial check array corresponding to an encoding mode of the RS code, and according to preset corresponding relationships between types of errors of the hard-decision result value sequence and error-correcting modes capable of correcting the errors, the error-correcting mode corresponding to the obtained type of the error of the hard-decision result value sequence is determined, and a bit error correction is performed on the hard-decision result value sequence according to the error-correcting mode, and the hard-decision result value sequence after the bit error correction is output as the decoding result. By classifying types of errors of the hard-decision result value sequence, and using different decoding modes for different error types, the decoding performance of RS code can be efficiently improved, and the decoding complexity can be reduced.

Figure 4A:
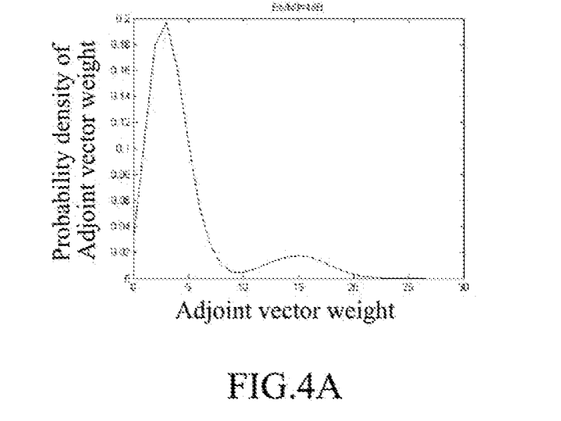
FIG. 4A is a schematic diagram of distribution of an adjoint vector weight in the embodiment of the invention.
Figure 4B:
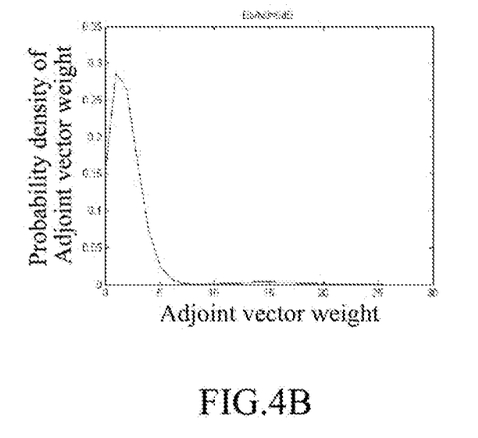
FIG. 4B is another schematic diagram of distribution of an adjoint vector weight in the embodiment of the invention.

For example, when the error types comprise the low reliability type error and the mixed type error, since the probability of the low reliability type error is far bigger than the mixed type error, and the method for decoding an RS code with the low reliability type error is simple, the complexity of the whole RS code decoding is low, which will be analyzed as follows:

It can be seen from FIG. 4A and FIG. 4B, when the bit signal to noise ratio is 4 dB, the probability density distribution function of the adjoint vector weight is clearly divided into two sections. It can be considered that a low reliability error occurs when the weight is between 0-10 and a mixed type error occurs when the weight is between 10-30, and it is easy to see that along with the increase of the bit signal to noise ratio, the probability of occurrence of a low reliability error greatly increases and the mixed type error decreases.

Figure 5:
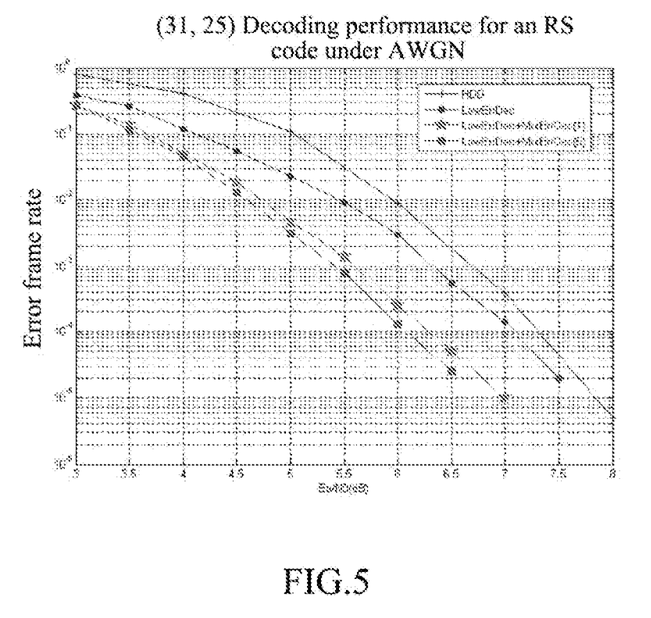
FIG. 5 is a schematic diagram of analysis of decoding performance for an RS code in the embodiment of the invention.

FIG. 5 illustrates the comparison (31, 25) of the performances of various decoding algorithms for RS code, and the error classifying threshold in simulation is $\gamma=10$. In the diagram, "HDD" represents the conventional hard-decision decoding; "LowErrDec" represents decoding only the low reliability type error and not the mixed type error; "LowErrDec+MixErrDec (1)" represents not only decoding the low reliability type error but also decoding the mixed type error using one time of iteration. "LowErrDec+MixErrDec (5)" represents not only decoding the low reliability type error but also decoding the mixed type error using 5 times of iteration. As can be seen from the diagram, at the location where the error frame rate is $10^{-4}$, "LowErrDec" decoding obtains 0.3 gain compared with the "HDD" decoding, and after the mixed type error decoding using single time of iteration, "LowErrDec+MixErrDec (1)" decoding can obtain 1 dB gain compared with "HDD". When the number of times of iteration of the mixed type decoding is increased to 5, "LowErrDec+MixErrDec (5)" obtains a gain of 1.2 dB compared with "HDD".

Obviously, those skilled in the art may make various modifications and deformations on the invention without deviating from the spirit and scope of the invention. Thus, if these modifications and deformations of the invention fall into the scope of the claims of the invention or its equivalent technologies, the invention is intended to comprise these modifications and deformations.

What is claimed is:

1. A method for decoding an RS (Reed-Solomon) code, the method comprising:
  receiving bit reliability information of the RS code output by a channel; and performing a hard decision on the received bit reliability information to obtain a hard-decision result value sequence;
  determining a type of an error of the hard-decision result value sequence according to an initial check array corresponding to an encoding mode of the RS code;
  according to preset corresponding relationships between types of errors of the hard-decision result value sequence and error-correcting modes capable of correcting the errors, determining an error-correcting mode corresponding to the type of the error of the hard-decision result value sequence, and performing a bit error correction on the hard-decision result value sequence according to the determined error-correcting mode;
  outputting the hard-decision result value sequence after the bit error correction as a decoding result.

2. The method according to claim 1, wherein, the step of determining a type of an error of the hard-decision result value sequence according to an initial check array corresponding to an encoding mode of the RS code is:
  sequencing reliability numerical values comprised in the bit reliability information;
  selecting (n-k) columns corresponding to (n-k) smallest reliability numerical values after the sequencing from the initial check array, and converting the selected (n-k) columns to a unit array to obtain a new check array, wherein, the n is a binary code length of the RS code, and the k is a binary information length of the RS code before being encoded;
  determining that the type of the error of the hard-decision result value sequence is a low reliability error or a mixed type error according to the new check array.

3. The method according to claim 2, wherein, the step of determining that the type of the error of the hard-decision result value sequence is a low reliability error or a mixed type error according to the new check array is:
  A, constituting a hard-decision vector having a same number of rows as the new check array by every hard-decision result value in the hard-decision result value sequence;
  B, calculating a product of the new check array and the current hard-decision vector, and performing a modulo 2 operation on the product result to obtain an adjoint vector; determining a number of 1 in the adjoint vector, and taking the determined number as an adjoint vector weight;
  C, judging whether the adjoint vector weight is less than a preset threshold value, and if yes, determining that the type of the error of the hard-decision result value sequence is the low reliability error; or else, determining that the type of the error of the hard-decision result value sequence is the mixed type error.

4. The method according to claim 3, wherein, when the type of the error of the hard-decision result value sequence is the low reliability error, the error-correcting mode corresponding to the low reliability error is:
  searching the adjoint vector for rows whose numerical values are 1, and determining columns whose numeral values are 1 in the found rows in the new check array;
  flipping bits corresponding to the columns in the hard-decision result value sequence.

5. The method according to claim 3, wherein, when the type of the error of the hard-decision result value sequence is the low reliability error, the error-correcting mode corresponding to the low reliability error is:
recoding and calculating check bits by taking high reliability bits in the hard-decision result value sequence as information bits and the new check array as a check warranty, and updating low reliability bits in the hard-decision result value sequence using obtained the check bits;
wherein, the low reliability bits are the bits corresponding to the (n-k) information having the smallest numerical values after sequencing the bit reliability information, and the high reliability bits are k bits other than the bits corresponding to the (n-k) information having the smallest numerical values.

6. The method according to claim 3, wherein, when the type of the error of the hard-decision result value sequence is the mixed type error, the error-correcting mode corresponding to the mixed type error is:
for each of columns other than the (n-k) columns in the new check array, calculating an associated value of each column with the current adjoint vector;
selecting a maximum associated value obtained by calculation, determining columns in the new check array used for calculating the maximum associated value, and flipping bits in the current hard-decision vector corresponding to the determined columns, and returning to step B.

7. The method according to claim 3, wherein, the preset threshold value is a threshold value corresponding to the initial check array of the RS code obtained by simulation.

8. A device for decoding an RS (Reed-Solomon) code, comprising a channel information receiving unit, a hard-decision unit, an error type determining unit, a bit error correcting unit and a decoding result outputting unit; wherein,
the channel information receiving unit is configured to receive bit reliability information of the RS code output by a channel;
the hard-decision unit is configured to perform a hard decision on the bit reliability information to obtain a hard-decision result value sequence;
the error type determining unit is configured to determine a type of an error of the hard-decision result value sequence according to an initial check array corresponding to an encoding mode of the RS code;
the bit error correcting unit is configured to, according to preset corresponding relationships between types of errors of the hard-decision result value sequence and error-correcting modes capable of correcting the errors, determine an error-correcting mode corresponding to the type of the error of the hard-decision result value sequence, and perform a bit error correction on the hard-decision result value sequence according to the determined error-correcting mode;
the decoding result outputting unit is configured to output the hard-decision result value sequence after the bit error correcting unit performing the bit error correction as a decoding result.

9. The device according to claim 8, wherein, the error type determining unit comprises a reliability sequencing unit, a check array Gaussian eliminating unit and an error type classifying unit; wherein,
the reliability sequencing unit is configured to sequence reliability numerical values comprised in the bit reliability information;
the check array Gaussian eliminating unit is configured to select (n-k) columns corresponding to (n-k) smallest reliability numerical values after the sequencing from the initial check array, and convert the selected (n-k) columns to a unit array to obtain a new check array, wherein, the n is a binary code length of the RS code, and the k is a binary information length of the RS code before being encoded;
the error type classifying unit is configured to determine that the type of the error of the hard-decision result value sequence is a low reliability error or a mixed type error according to the new check array.

10. The device according to claim 9, wherein, the error type classifying unit comprises an adjoint weight calculating unit and a threshold deciding unit; wherein,
the adjoint weight calculating unit is configured to constitute a hard-decision vector having a same number of rows as the new check array by each hard-decision result value in the hard-decision result value sequence, calculate a product of the new check array and the current hard-decision vector, and perform a modulo 2 operation on the product result to obtain an adjoint vector; determine a number of 1 in the adjoint vector, and take the determined number as an adjoint vector weight;
the threshold deciding unit is configured to judge whether the adjoint vector weight is less than a preset threshold value, and if yes, determine that the type of the error of the hard-decision result value sequence is the low reliability error; or else, determine that the type of the error of the hard-decision result value sequence is the mixed type error.

11. The device according to claim 10, wherein, the bit error correcting unit comprises a first low reliability error decoding unit and/or a second low reliability error decoding unit, wherein:
the first low reliability error decoding unit is configured to search the adjoint vector for rows whose numerical values are 1, and determine columns whose numeral values are 1 in the found rows in the new check array; flip bits corresponding to the columns in the hard-decision result value sequence;
the second low reliability error decoding unit is configured to recode and calculate check bits by taking high reliability bits in the hard-decision result value sequence as information bits and the new check array as a check warranty, and update low reliability bits in the hard-decision result value sequence using obtained the check bits; wherein, the low reliability bits are the bits corresponding to the (n-k) information having the smallest numerical values after sequencing the bit reliability information, and the high reliability bits are k bits other than the bits corresponding to the (n-k) information having the smallest numerical values.

12. The device according to claim 10, wherein, the bit error-correcting unit comprises a first mixed type error decoding unit and/or a second mixed type error decoding unit, wherein:
the first mixed type error decoding unit is configured to, for each of columns other than the (n-k) columns in the new check array, calculate an associated value of each column to the current adjoint vector; select a maximum associated value obtained by calculation, determine columns in the new check array used for calculating the maximum associated value, and flip bits in the current hard-decision vector corresponding to the determined columns, and trigger the adjoint weight calculating unit;
the second mixed type error decoding unit is configured to output the hard-decision result value sequence as a decoding result.

13. The device according to claim 10, wherein, the preset threshold value is a threshold value corresponding to the initial check array of the RS code obtained by simulation.

14. The method according to claim 4, wherein, the preset threshold value is a threshold value corresponding to the initial check array of the RS code obtained by simulation.

15. The method according to claim 5, wherein, the preset threshold value is a threshold value corresponding to the initial check array of the RS code obtained by simulation.

16. The method according to claim 6, wherein, the preset threshold value is a threshold value corresponding to the initial check array of the RS code obtained by simulation.

17. The device according to claim 11, wherein, the preset threshold value is a threshold value corresponding to the initial check array of the RS code obtained by simulation.

18. The device according to claim 12, wherein, the preset threshold value is a threshold value corresponding to the initial check array of the RS code obtained by simulation.

* * * * *